(12) United States Patent
Chawla et al.

(10) Patent No.: US 9,490,560 B2
(45) Date of Patent: Nov. 8, 2016

(54) MULTI-ARRAY BOTTOM-SIDE CONNECTOR USING SPRING BIAS

(71) Applicant: INTEL CORPORATION, Santa Clara, CA (US)

(72) Inventors: Gaurav Chawla, Tempe, AZ (US); David J. Llapitan, Tacoma, WA (US); Jeffory L. Smalley, Olympia, WA (US); Tejinder Pal Aulakh, Auburn, WA (US); Vijaykumar Krithivasan, Chandler, AZ (US); Donald T. Tran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 14/576,735

(22) Filed: Dec. 19, 2014

(65) Prior Publication Data

US 2016/0181714 A1 Jun. 23, 2016

(51) Int. Cl.
*H01R 12/79* (2011.01)
*H05K 7/10* (2006.01)
*H01R 43/20* (2006.01)
*G06F 1/18* (2006.01)

(52) U.S. Cl.
CPC ............. *H01R 12/79* (2013.01); *G06F 1/18* (2013.01); *H01R 43/205* (2013.01); *H05K 7/1069* (2013.01); *H05K 7/1092* (2013.01)

(58) Field of Classification Search
CPC ... H05K 7/1007; H05K 7/1069; H01R 12/79

USPC .............................................. 361/760; 439/66
See application file for complete search history.

(56) References Cited

U.S. PATENT DOCUMENTS

| | | | | | |
|---|---|---|---|---|---|
| 4,169,642 | A | * | 10/1979 | Mouissie | G04G 17/02 257/E23.086 |
| 5,205,741 | A | * | 4/1993 | Steen | G01R 1/0425 324/762.02 |
| 5,383,787 | A | * | 1/1995 | Switky | H01L 23/32 439/67 |
| 6,859,854 | B2 | * | 2/2005 | Kwong | G06F 3/0607 361/679.33 |
| 9,265,170 | B2 | * | 2/2016 | Swaminathan | H01R 12/716 |
| 2014/0162475 | A1 | | 6/2014 | Chawla et al. | |
| 2014/0199873 | A1 | | 7/2014 | Liu et al. | |
| 2014/0218870 | A1 | | 8/2014 | Ho et al. | |
| 2014/0268577 | A1 | * | 9/2014 | Swaminathan | H05K 1/0204 361/719 |

* cited by examiner

*Primary Examiner* — Adrian S Wilson
(74) *Attorney, Agent, or Firm* — Blakely, Sokoloff, Taylor & Zafman LLP

(57) ABSTRACT

A connector for a multi-array bottom side array is described that uses a spring bias. In one example, a connector includes a connector housing, the connector housing having a bottom surface, and a plurality of resilient connectors opposite the bottom surface to electrically connect to a corresponding plurality of pads of an integrated circuit package, a cable connector to electrically connect the resilient connectors to a cable, a base plate having a bottom surface to press against a circuit board, and a top surface opposite the bottom surface, and plurality of spring members coupled between the base plate and the connector bottom surface to press the base plate bottom surface against the system board and to press the connector housing connectors against the package.

20 Claims, 7 Drawing Sheets

MULTI-ARRAY BOTTOM-SIDE CONNECTOR USING SPRING BIAS

FIELD

The present description relates generally to the field of integrated circuits, and more particularly, to integrated circuit connectors using a spring bias.

BACKGROUND

Integrated circuit (IC) dies are frequently attached to a package substrate and then covered with a package cover to protect the die and provide connections to other devices. In some systems, the package is installed into a socket that is attached to a system board, motherboard, daughter board or another type of system printed circuit board. The package substrate has a pattern of pads or lands and the socket has a corresponding pattern of connectors, such as pins or balls that make electrical contact with the package substrate. The connection allow for power, data, and control signals to be communicated between the IC die and the system board through the socket and the package substrate.

In addition to the socket connection, cables are sometimes used to connect the die to another component without going through the socket and the system board. The cable can allow for a more direct connection to the other component. This improves the speed and data capabilities of the connection. Higher speeds are particularly helpful for connection to local memory, or other general purpose and graphics processors.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In embodiments, a bottom side connector (BSC) for an IC package substrate has a floating assembly on a spring loaded mechanism. The floating assembly compensates for any height mismatch between a socket and connector contacts. The difference in height may be caused by the tolerance stackup between the two components among other causes.

A BSC is a connector that connects to the underside of the package substrate outside of the socket. This kind of connector is easy to assemble and has high electrical performance. The BSC also makes it possible to use a small or large array of connectors. Multiple BSCs may be used around the perimeter of the package. As a separate connector, a BSC may also be modified with new designs without changing the socket.

In some embodiments, a socket for an IC die package, such as an LGA (Land Grid Array) socket is surface mounted or otherwise attached to a motherboard. The bottom side connector with high speed cables already attached is placed in a fitting on the edge of the socket. The connector assembly is not permanently attached to the motherboard or to the socket, but floats vertically up or down. Other movements are constrained by alignment features designed into a bolster plate, the socket, and/or motherboard.

The package sits on the resilient connection pins of the socket and is clamped or otherwise held in place so that the position of the package relative to the socket does not significantly change. If the socket is surface mounted on the motherboard, then the socket may sit higher or lower on the motherboard based on variations in the surface mount process. The variation may be for example +/−200 um. The ultimate height of the package off the motherboard will vary with variation in the socket position. There are other sources of height variation as well. The package connector contacts for example, may lose some deflection due to tolerance mismatches.

Figure 1:
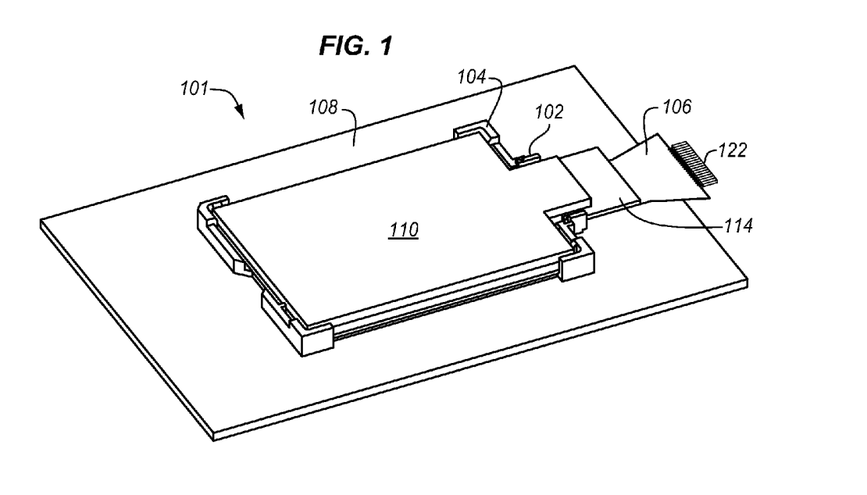
FIG. 1 is a top isometric view of a portion of a circuit board with an IC package and connector assembly according to an embodiment.

FIG. 1 is a top isometric view of an IC assembly 101 having an IC connector 102 and a socket 104. The socket is attached to a circuit board 108, such as a system board or motherboard. An IC die (not shown) is attached to the socket through a package substrate and the die and the substrate are covered with an IHS (Integrated Heat Spreader) 110 or any other suitable cover. A flex cable or other type of signal carrier or conductor 106 is coupled to the connector. In the IC assembly 101, the IC connector 102 may be mated with the socket however the embodiments are not so limited. The cable is electrically connected on the bottom surface of the IC connector between the IC connector and the circuit board 108. Alternatively, the cable may be on the top surface of the IC connector. The IC package substrate 112 is seated in the socket and a diving board 114 of the IC package substrate extends over the IC connector 102. The IHS may also extend over a portion of the diving board as shown.

In the IC assembly, signal contacts, such as pads (not shown) on the bottom surface of the IC package substrate are coupled with the signal contacts for routing signals from the package substrate through the socket and into the circuit board. Other signal contacts (not shown) on the bottom surface of the IC package substrate are coupled with signal contacts of the cable via signal carriers in the IC connector. This allows signals from the IC package substrate to be routed through the cable to other devices without having to go into the circuit board The diving board that extends out of the socket body provides space for a bottom side connector (BSC). This additional BSC does not require any space within the socket and so overcomes any space limitations within the socket. The IHS can also extend out to and even over the diving board for additional protection and heat spreading purposes, as shown. As described in more detail below, the BSC may be coarsely aligned to the substrate through features on one or more of several stacked components, a bolster plate, the motherboard, and the socket, under the diving board region. As a result none of the connector components are required to be attached to the motherboard by solder or in any other way. The connector contacts make connection with lands on the bottom side of the diving board similar to how the socket contacts engage with rest of the package pads. The bottom of the connector is attached to an interposer or flex cable, which will be attached to low loss, high-speed cables on the other end.

Figure 2:
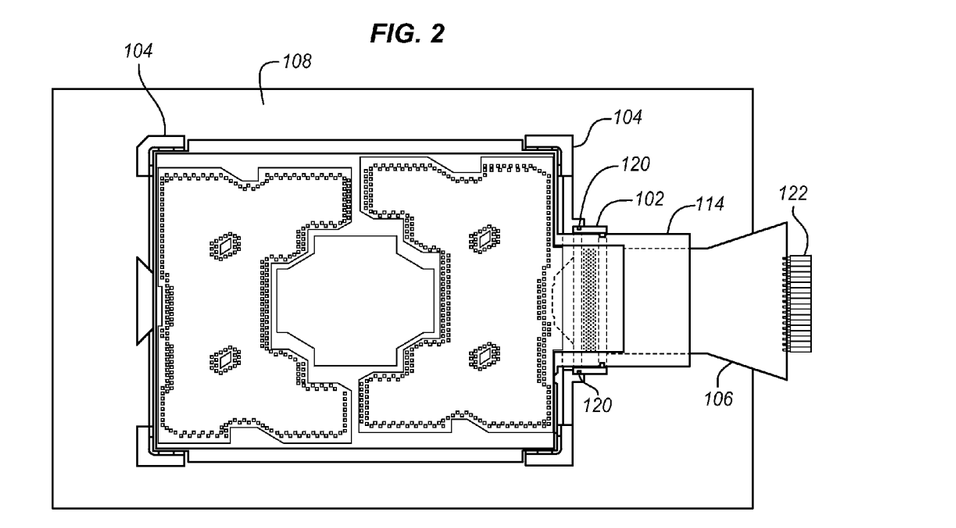
FIG. 2 is a top plan partially transparent view of the assembly of FIG. 1 according to an embodiment.

FIG. 2 is a partially transparent top plan view of the assembly 101 of FIG. 1. The socket 104 has a large number of connectors for the main part of the package. The socket also has a pair of opposing fingers 120 that hold the connector 102 in place over the circuit board. The connector is able to move vertically but is prevented from horizontal movement (in the plane of the figure) by the fingers that engage corresponding grooves on the socket. The cable extends out of the socket and ends in a coaxial connector 122. The connector allows for a longer cable to carry signals to another device.

FIGS. 1 and 2 show only a portion of a circuit board for illustration purposes. A typical circuit board will have many more components and connectors for memory, mass storage, input/output devices, as well as power supply, timing, interconnection, and hub devices. The coaxial connector 122 allows the package to attach to one of these components directly.

The flex cable 106 or flex substrate has multiple signal contacts (not shown) in the connector housing. The signal contacts may be formed as "bumps" on a surface of a flexible film, and may be coupled with signal carriers (not shown) that are printed on or in the film and that run from the signal contacts at the first end of the cable connected to the connector 102 to the middle part of the cable (referred to as "flex signal carriers"). A variety of other types of cables and cable connectors may alternatively be used. In the illustrated embodiment, the cable widens in a fan-out portion in a direction away from the first end. The distance between the flex signal carriers may increase in this fan-out portion. This allows the cable to connect to a cable which has more space between carriers.

In this embodiment, the flex signal carriers are configured to couple with coaxial signal carriers 122 at the second end of the cable opposite the IC connector. In some embodiments, the cable has a flex portion and a coaxial portion. The flex portion (which may have a smaller height than a coaxial cable) may be used to fit into a small gap between the IC connector 102 and the circuit board 108. A coaxial cable, which typically requires two or more millimeters of space to accommodate an attachment point, may not be able to fit into this gap, especially when multiple coaxial cables may need to be stacked in order to accommodate a multi-row arrangement of signal contacts in an IC connector. However, since flex cables are typically lossier than coaxial cables, a coaxial portion may attach to the flex portion at a point away from the IC connector, which may reduce the losses of the cable relative to a cable formed entirely from flex cable.

Figure 3:
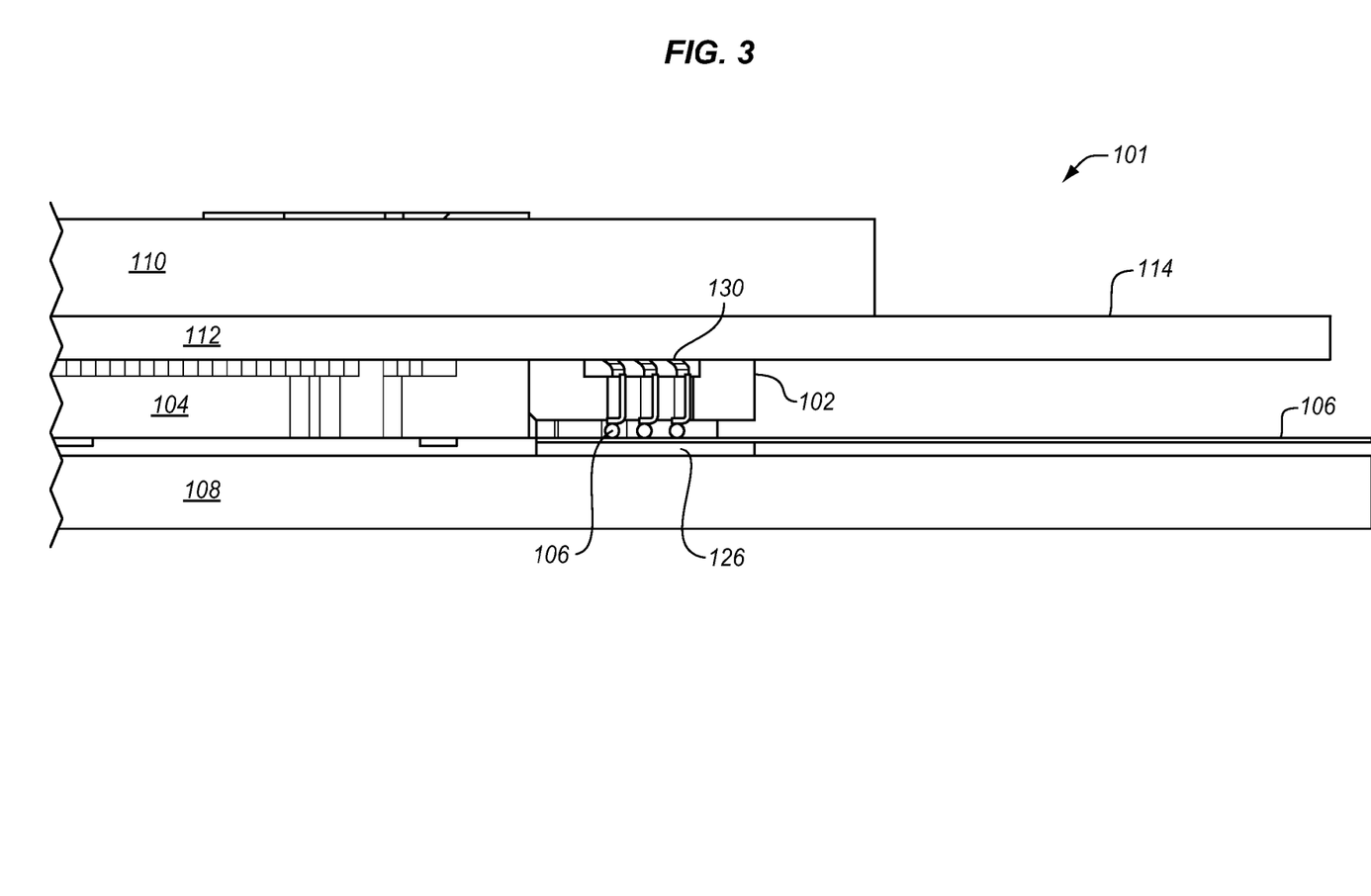
FIG. 3 is a side cross-sectional view of an IC connector according to an embodiment.

FIG. 3 is a cross-sectional side view of a portion of the assembly of FIG. 1. The IC assembly 101 includes an IC package substrate 112 which has contacts to connect to the IC die (not shown) of the package and contacts on the bottom surface to connect to the socket. The signal contacts on the IC package substrate route signals (e.g., electrical and/or optical signals) to and from other components on the circuit board 102 through the socket. A second set of signal contacts 130 on the bottom surface of the IC package substrate couple with corresponding signal contacts of the IC connector 102.

The IC package substrate 112 includes an extension 114 over the IC connector that is referred to herein as a "diving board." When the IC package substrate is coupled with the socket on the circuit board, the diving board 112 extends away from the socket to provide space for signal contacts on the bottom surface of the IC package substrate. In some embodiments, the IHS or an HMC (heat management component) 110 may extend away from the socket to at least partially cover the diving board. The HMC is coupled to the IC package substrate 112. The HMC 110 may include an integrated heat spreader (IHS), a thermal interface material (TIM, not shown), a heat sink, any other heat management component, or any combination of the foregoing.

The cable connector 102 is positioned under the diving board and HMC extension and supported by a stiffener plate 126. The stiffener plate is between the circuit board 102 on one side and the cable connector on the other side. Spring members (not shown) are used to push the cable connector away from the stiffer plate and toward the BSC 130 on the bottom side of the substrate extension 112. The flex cable 106 is attached to the IC connector using solder joints, adhesives or another technique. In one example SMT (surface mount technology) is used to attach the cable to the IC connector. Accordingly, when the IC connector connects to the BSC of the substrate, the cable is connected to the contacts of the BSC. As shown, there will be a variation in connector contact tip positions due to the differences between the heights of the components and the respective tolerances. The package 112 height is driven by the socket 104 seating plane. However, the connector 102 height is driven by the PC board position. The variations in connector contact tip positions may be addressed using spring members as discussed in more detail below.

The assembly of FIGS. 1, 2, and 3 are simplified for purposes of explanation. Just as there may be more packages, socket, and other components on the circuit board, there also may be more IC connectors for each socket. Additional IC connectors may be added beside the one shown or on other sides of the package. The package substrate may have more connectors to connect with more IC connector and more cables. The package may also have more than one IC die. The dies may connect to different cables or the connections may be shared so that more than one die is connected to the same cable. The package substrate includes routing layers that allow the connections on the IC die to be connected to connections on the socket or any one or more of the cables.

Figure 4:
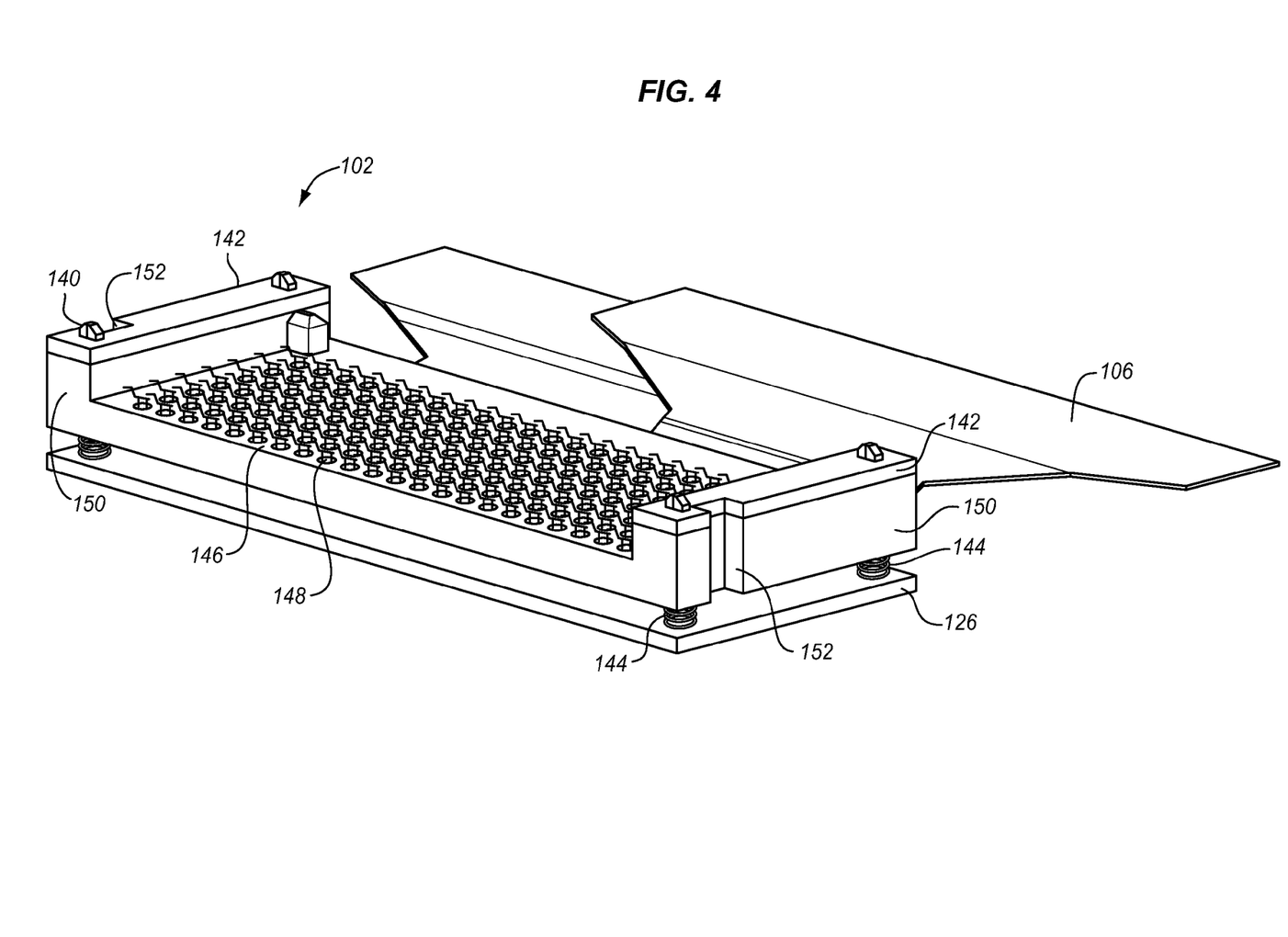
FIG. 4 is a top isometric view of an IC connector according to an embodiment.

FIG. 4 is a perspective view of the IC connector 102, including the cable 106. The cable connector has two side walls 150 one on either side of a flat bed 146. The side walls are hollow inside and include vertical grooves 152 to serve as a mechanical mating feature to align with the fingers 120 of the socket. These grooves allow the socket to hold the IC connector in place. While the mating features are shown as grooves, a more complex or different mating feature may be used including more grooves, protrusions, tabs, notches, or other keyed elements to improve alignment between the socket and the IC connector and secure the fit when the socket and the IC connector are mated. The mating features also serve to align the IC package substrate with the IC connector through the socket. There may also be mating features for the package substrate. For example, ridges may be used to align with complementary features in the extension 114 of the IC package substrate to ensure proper alignment between the IC connector and the contact pads of the IC package substrate.

The flat bed 146 between the side walls carries an array of signal carriers 148 to connect with the BSC of the package substrate. These may take any desired form depending on the nature of the BSC. In some embodiments, LGA (Land Grid Array) contacts are installed across the surface of the flat bed to connect with as many substrate contacts as are desired. The signal carriers 148 may have solder balls disposed at one end to mechanically contact the signal contacts of the cable 106 which is soldered to the bottom of the IC connector. Alternatively, the cable 106 may be attached in other ways and on the top side of the IC connector.

The cantilevers of the LGA signal carriers 148 extend away from the top surface of the IC connector, while the other ends of the signal carriers extend into the cable connector to make contact with the signal contacts on the cable. In alternate embodiments, the signal carriers may be vertical contacts instead of or in addition to LGA contacts. In alternate embodiments, the signal carriers may be replaced with spring elements. As shown, multiple cables may be used to support all of the electrical contacts in the LGA array. In this embodiment, there are two cables, however any other number may be used. There may also be different types of cables. For example, there may be one type of cable for DC power and another type of cable for high speed data.

Figure 5:
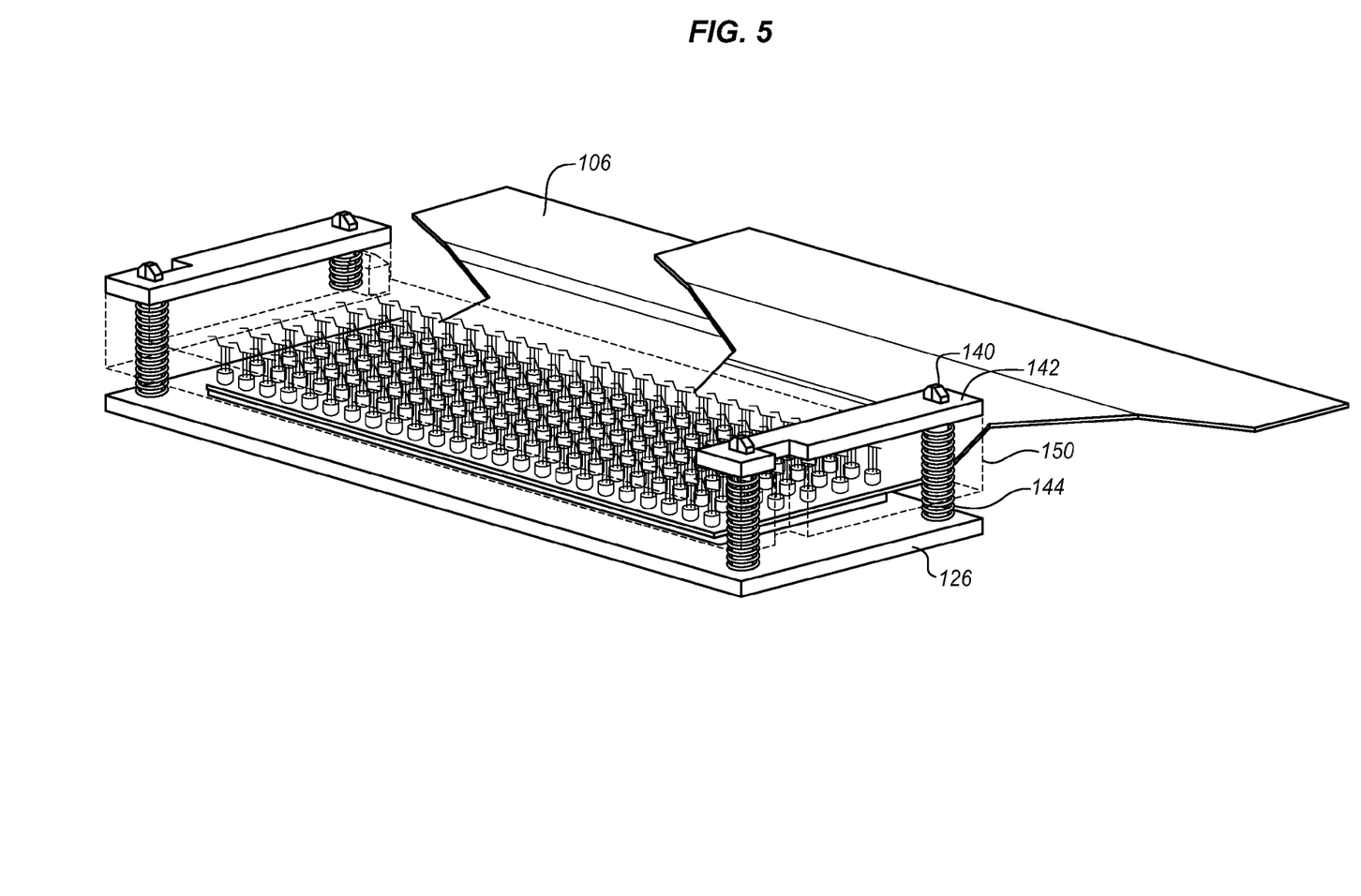
FIG. 5 is a partially transparent top isometric view of the IC connector of FIG. 4 according to an embodiment.

The IC connector 102 is also attached to the stiffener plate 126 using an array of posts 140. There is one post at each of the four corners of the rectangular connector, however, more or fewer may be used and the positions of the posts may be adapted to suit the shape of the connector. The posts are attached through brackets 142 at the top of the connector, through the side walls of the connector, and through the stiffener plate. The brackets reinforce the top of the connector to secure the posts without stressing the connector. As shown in FIG. 5, a partially transparent view of the connector of FIG. 4, the side walls of the connector may have a hollowed area or opening for the posts. The posts run through the opening inside the connector side walls. In the illustrated example, the opening is through the entire side wall, however, the opening may be in the form of open shafts, gaps, tubes, or slots. The size and shape of the openings may be configured to suit the size and the shape of the springs 144 inside the side wall.

The posts are each threaded through the center of coil spring 144. Each coil spring is held in place by one of the posts at each corner of the connector. The coil spring is wrapped around the post and is a compression spring so that it resists compression of the connector against the stiffer plate. While a compression spring is shown, any other spring member may be used such as a leaf spring, a torsion bar, or an elastomeric or foam material. The bottom of the spring rests on the top of the stiffener plate and the top of the spring rests on the bottom of the inside opening of the connector side wall. The shape of the side wall and the spring connection may be adapted to suit the particular type of spring member that is used. The particular surfaces that contact the spring may be adapted to suit different spring configurations and variations in the shape of the connector housing.

The spring constant of the springs 144 is selected based on the spring force asserted by the land grid array. The springs push the land grid array against the BSC of the substrate. The springs apply enough force that each LGA contact is pressed against the corresponding contact of the package substrate BSC. The springs also compensate for any variations on the surface of the PC board that supports the stiffener plate.

Figure 6:
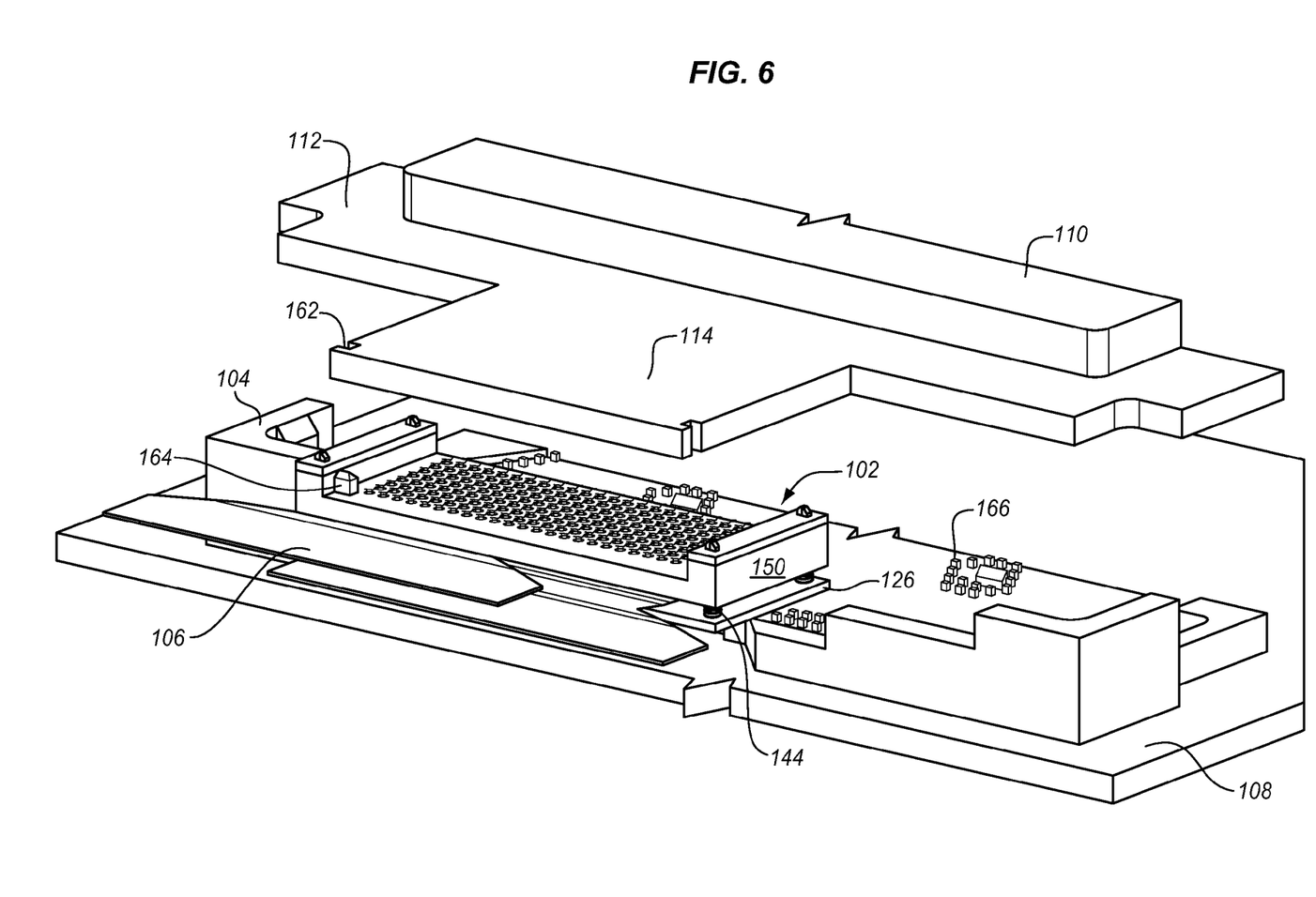
FIG. 6 is an exploded view of a connector and socket assembly with a circuit board and an IC package according to an embodiment.

FIG. 6 is an exploded view of a portion of the assembly 101 of FIG. 1. As shown the socket 104 is mounted to the PC board. The socket has connectors 166 to mate with electrical contacts on the package substrate or with other components (not shown). The IC connector 102 is to be lowered in place in a location of the socket and is held in place by the socket. While the connector has a stiffener plate to physically contact the PC board 108, it is not necessarily attached to the connector plate. Alternatively, the socket may extend out away from the IC package underneath the connector so that the connector rests on top of the socket. The connector is held in place with mating features as shown in the other diagrams.

The package substrate 112 is placed over the socket and the substrate extension 114 is placed over the connector 102. The substrate is in this way able to make electrical connections with the socket and the connector. An HMC 110 is attached over the package substrate and covers the IC die inside. In this example, the package substrate has an additional registration feature 162, in this case a groove, that mates with a tab 164 on the inside of the side wall of the connector. The design of individual components can be modified for manufacturability, reliability, and cost. Also, the spring and stiffener design requirements will vary based on the number of contacts on the connector and the load that needs to be applied.

The substrate extension 114 is configured to fit between the side walls 150 of the connector. This reduces movement from side-to-side between the side walls of the connector. The groove and tab registration system reduces lateral movement of the package or of the connector along the side walls of the connector. The package substrate in this way is able to substantially eliminate any horizontal movement of the connector and ensure that the connector LGA aligns with the connectors on the substrate BSC.

Since the package substrate may also have alignment features with the socket to ensure proper registration on the socket, using the groove and tab, the connector is aligned with respect to the socket through the package substrate. As shown in FIG. 6, the groove and tab may be used instead of the mating features between the socket and connector. The connector is directly aligned with the package substrate. Alternatively the mating features 120, 152 with the socket may be used for a coarse positioning or approximate alignment. The groove and tab may be used in the same assembly for more accurate alignment.

There are a variety of different ways to assemble the connector 102 in the stack of components. In one example, the connector is placed close to the socket before the package is installed. This is a coarse alignment step. This may be done using an extension of the posts 140 of the connector and indents or holes on the motherboard. The connector may also be aligned to the socket using mating features. Once the connector is installed, the package 112 is placed on the socket, and pushed through features 162, 164 on the connector and substrate. These features provide fine alignment which results in connector contacts landing on package pads.

As described the connector housing carries or holds the contacts to connect with the BSC (LGA, or any spring type contact). It has a base or stiffener plate with springs that allow the housing to float above the base in the height, vertical, or z-direction. The connector is designed with a specified pitch and contact deflection range. The spring-loaded base overcomes the tolerance variation between the connector and the socket and imperfections in the packet substrate. As a result, the contacts require less deflection. This allows for shorter contacts and may result in a smaller package pad. The shorter contacts improve the high-speed performance of the connector, and also reduce the risk of bent connector pins.

The springs and alignment features cause the connector contacts to fully deflect and maintain electrical connection with the package despite any variation caused by tolerance mismatches between the socket and the connector assembly. A nominal offset may be intentionally designed into the heights of the connector and socket, so that the connector seating plane is initially higher than the socket seating plane. Once the connector contacts are deflected, the coil springs also deflect, and the connector seating plane lines up with the socket seating plane. The initial offset may be configured for different types of sockets, connections, and package substrates.

Many sockets use a bolster plate attached to the circuit board to securely hold the socket in place. The bolster plate redistributes the stresses on the circuit board that may be caused by the socket and also helps to ensure that the socket is properly aligned on the circuit board. The bolster plate may also have registration features to align the connector to hold in in place vertically, to provide a surface for the stiffener plate or to perform other functions described herein that would otherwise be performed by features on the circuit board or the socket. The bolster plate may also be used to provide additional alignment, support, and retention functions.

Features in the bolster plate may be used for gross alignment between the connector and the substrate. This may be used to help the user in installation of the connector in the right location. Using the bolster plate for this purpose will reduce the number of holes needed in the circuit board. Alignment holes in the motherboard take away the space for routing of the circuit lines. The bolster plate may be used to allow more space for routing.

Figure 7:
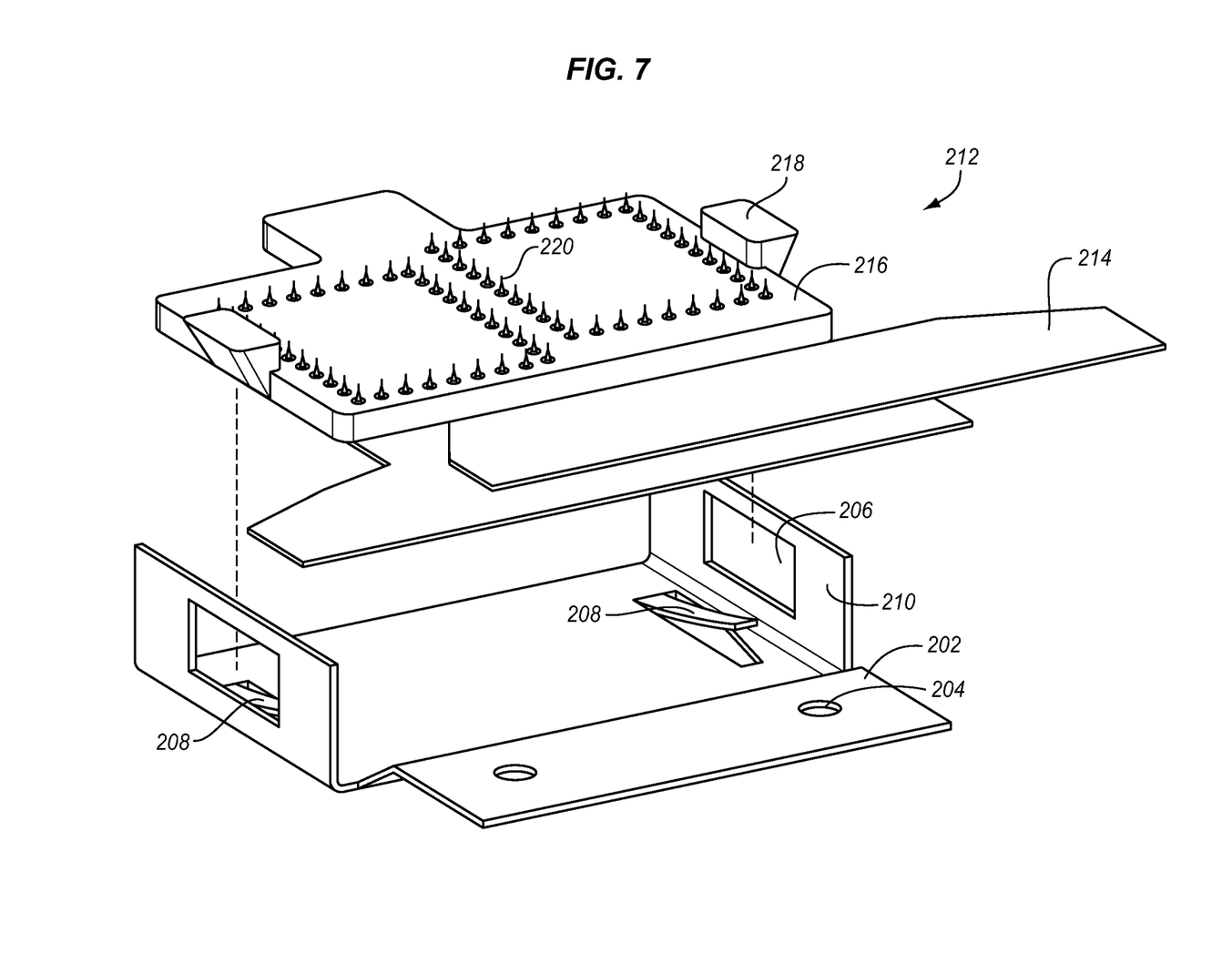
FIG. 7 is a top isometric exploded view of an alternative connector according to an embodiment.

FIG. 7 shows an alternative design for a connector 212 in which the coil springs have been replaced by leaf springs. A base plate 202 has an optional attachment mechanism 204 in the form of rivet, clip, or other fastener holes. This allows the base plate to be attached to the motherboard, the socket or the bolster plate. The holes 204 may also serve as an alignment feature because for attachment the holes must be aligned with corresponding holes, pins, or other features on the motherboard through the holes. The base plate is then registered to a particular position on the motherboard. This position may then be related to the position of a socket or bolster that is also attached to the motherboard so that the socket and the connector are aligned with respect to each other through the common motherboard.

The base plate has side walls 210 that extend vertically from the base on either side of the connector housing 212. The side walls have openings 206 which serve as mating features for tabs 218 on either side of the connector housing. Leaf springs 208 are formed from the base of the base plate and extend upward from the bottom of the base plate toward the connector housing.

The connector housing 212 is placed between the side walls of the base plate 202 and pushed down until the tabs 218 lock into place in the openings 206 of the side walls. The tabs allow for vertical movement of the connector housing so that the leaf springs 208 can move the connector housing vertically to press against the package BSC. The top side of the connector housing has a contact array 220 that connects to cables 214 that extend from the connector housing to connect to another device.

The leaf springs also relieve the height requirements typically imposed by coil springs. Since the leaf springs are not as tall, the connector may be made shorter to fit in a more confined space than coil springs. In addition, more leaf springs may be added on the base plate 202 to spread out across the base and provide a more uniform reaction force on the connector bottom when it is loaded on the top through the package.

The described embodiments compensate for a wide range of height variations. These embodiments may be modified to include different types of spring design and alignment features in the socket and in the bolster plate for initial alignment of the connector with the package substrate. With the described embodiments, the coil springs on the base may be preloaded such that contacts pins always deflect fully and so that the package substrate touches the connector seating plane, before the coil springs see any deflection. This design function may be used to maintain minimum force on the connector contacts.

By ensuring that the contacts on the connector always have at least the intended nominal deflection, a good electrical connection with the package may be assured. The springs may also be used to reduce the contact force and the loading mechanism load requirement. Because the contacts are nominally deflected by the spring members of the connectors and the size of the connector array is smaller than the connection array on the socket, the total force on the package against the sockets is not increased. A reduced force over the socket allows the clamping or holding mechanism of the socket to be simplified.

The spring-loaded connector housing may be used in a variety of different applications including in test modules. The described connector which is not attached to the circuit board and which is held in place by the socket or the bolter plate is simple to install and does not require any additional process steps except to place the connector in position and connect the cables. The size of the connector array and of the bottom side connector on the substrate housing may be modified for increased or decreased pin count specifications.

Figure 8:
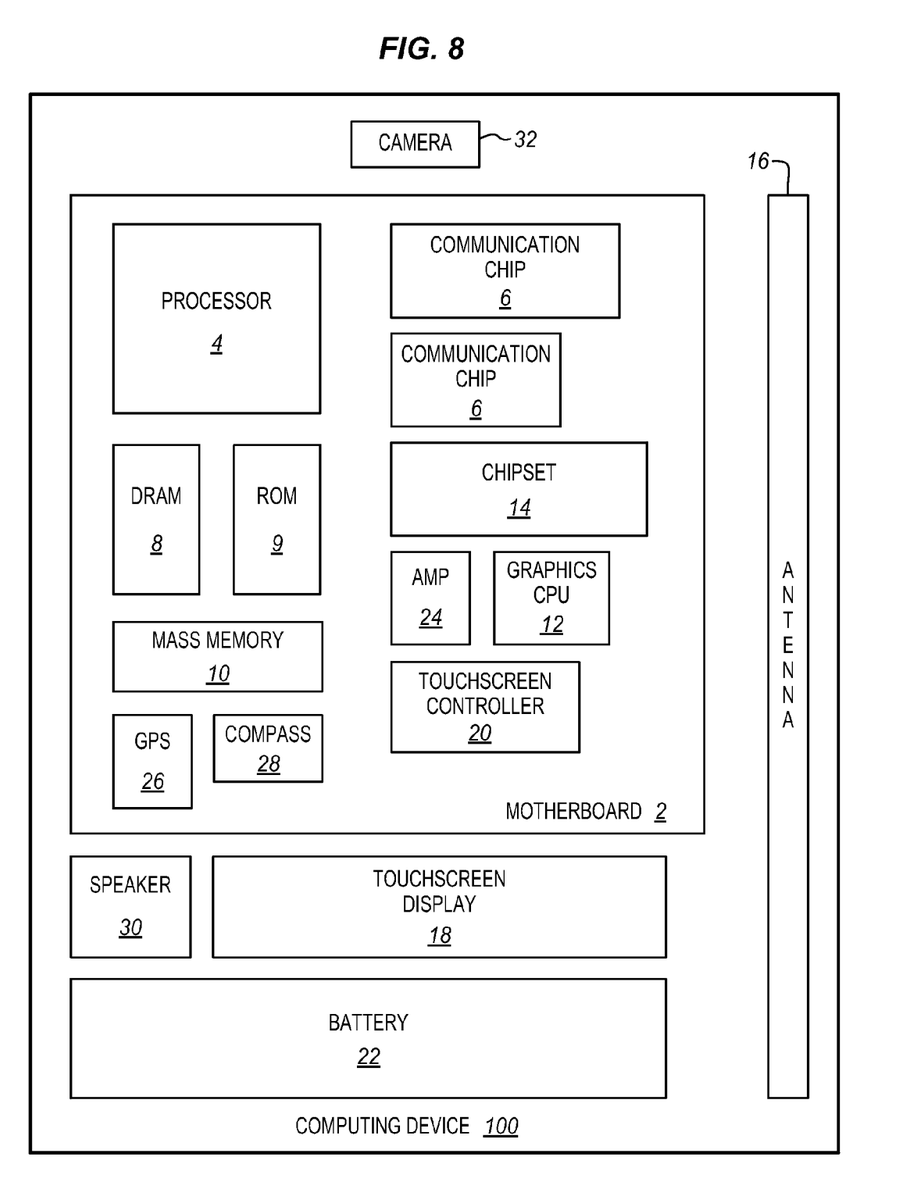
FIG. 8 is a diagram of a computing device suitable for use with a connector assembly according to an embodiment.

FIG. 8 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2. At least one of either the RF or digital die packages shielded using a pattern of metal lined vias in the package and the metal layer and electrically coupled to the board 2 through the package. In some implementations of the invention, any one or more of the components, controllers, hubs, or interfaces are coupled to other components using sockets, connectors, and cables as described above.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

In various implementations, the computing device 100 may be a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder. In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a connector that includes a connector housing, the connector housing having a bottom surface, and a plurality of resilient connectors opposite the bottom surface to electrically connect to a corresponding plurality of pads of an integrated circuit package, a cable connector to electrically connect the resilient connectors to a cable, a base plate having a bottom surface to press against a circuit board, and a top surface opposite the bottom surface, and plurality of spring members coupled between the base plate and the connector bottom surface to press the base plate bottom surface against the system board and to press the connector housing connectors against the package.

In further embodiments the base plate bottom surface presses against the circuit board through a direct physical connection to a top surface of the circuit board.

In further embodiments the base plate has alignment features to align with a particular position on the circuit board.

In further embodiments the spring members comprise coil springs mounted at each of four corners of the top surface of the base plate and contacting the bottom surface of the connector housing.

In further embodiments the spring members comprise leaf springs formed in the base plate and extending from the base plate to the bottom surface of the connector housing.

In further embodiments the cable connector is attached to the bottom surface of the connector housing between the spring members.

In further embodiments the resilient connectors comprise a land grid array.

In further embodiments the connector housing has mating features to align the connector housing with a socket for the integrated circuit package.

In further embodiments the connector housing has mating features to align the connector with a bolster plate attached to the circuit board and to a socket for the integrated circuit package.

In further embodiments the connector housing comprises side walls on each of two sides of the connector housing connectors, wherein the spring members comprise coil springs extending through the side walls on the two sides.

Further embodiments include a vertical groove in each side wall to serve as a mechanical mating feature to align with a corresponding feature on a socket.

In further embodiments the mechanical mating feature aligns the connector with the socket and substantially eliminates horizontal movement of the connector.

Some embodiments pertain to a computing device that includes a motherboard, a memory attached to the motherboard, a socket attached to the motherboard, a packaged processor attached to the socket, and a connector attached to the socket, the connector including a connector housing, the connector housing having a bottom surface, and a plurality of resilient connectors opposite the bottom surface to electrically connect to a corresponding plurality of pads of an integrated circuit package, a cable connector to electrically connect the resilient connectors to a cable, a base plate having a bottom surface to press against a circuit board, and a top surface opposite the bottom surface, and plurality of spring members coupled between the base plate and the connector bottom surface to press the base plate bottom surface against the system board and to press the connector housing connectors against the package.

In further embodiments the spring members comprise coil springs mounted at each of four corners of the top surface of the base plate and contacting the bottom surface of the connector housing.

In further embodiments the spring members comprise leaf springs formed in the base plate and extending from the base plate to the bottom surface of the connector housing.

In further embodiments the connector housing comprises side walls on each of two sides of the connector housing connectors, wherein the spring members comprise coil springs extending through the side walls on the two sides.

In further embodiments the connector is fastened to the circuit board using screws.

Some embodiments pertain to a method that includes attaching a socket to a circuit board, the socket configured to hold an integrated circuit die package, attaching a connector to the socket, the connector having a housing, the connector housing having a bottom surface, and a plurality of resilient connectors opposite the bottom surface to electrically connect to a corresponding plurality of pads of an integrated circuit package, the connector having a cable connector to electrically connect the resilient connectors to a cable, the connector having a base plate having a bottom surface to press against a circuit board, and a top surface opposite the bottom surface, and the connector having a plurality of spring members coupled between the base plate and the connector bottom surface to press the base plate bottom surface against the system board and to press the connector housing connectors against the package, and placing an integrated circuit die package in the socket, so that a first contact area of the package connects to the socket and a second contact area of the package connects to the connector.

In further embodiments placing comprises pressing the spring members against the circuit board so that the base plate bottom surface presses against the circuit board to ensure a connection between the second contact area and the connector.

In further embodiments attaching the connector comprises sliding a vertical groove on each of two side walls of the connector housing across a mating finger on the socket to align the groove with a corresponding finger and substantially eliminate horizontal movement of the connector.

What is claimed is:

1. An integrated circuit connector comprising:
    a connector housing, the connector housing having a bottom surface, and a plurality of resilient connectors opposite the bottom surface to electrically connect to a corresponding plurality of pads of an integrated circuit package;
    a cable connector to electrically connect the resilient connectors to a cable;
    a base plate having a bottom surface to press against a system board, and a top surface opposite the bottom surface; and
    plurality of spring members coupled between the base plate and the connector bottom surface to press the base plate bottom surface against the system board and to press the connector housing connectors against the package.

2. The connector of claim 1, wherein the base plate bottom surface presses against the circuit board through a direct physical connection to a top surface of the circuit board.

3. The connector of claim 1, wherein the base plate has alignment features to align with a particular position on the circuit board.

4. The connector of claim 1, wherein the spring members comprise coil springs mounted at each of four corners of the top surface of the base plate and contacting the bottom surface of the connector housing.

5. The connector of claim 1, wherein the spring members comprise leaf springs formed in the base plate and extending from the base plate to the bottom surface of the connector housing.

6. The connector of claim 1, wherein the cable connector is attached to the bottom surface of the connector housing between the spring members.

7. The connector of claim 1, wherein the resilient connectors comprise a land grid array.

8. The connector of claim 1, wherein the connector housing has mating features to align the connector housing with a socket for the integrated circuit package.

9. The connector of claim 1, wherein the connector housing has mating features to align the connector with a bolster plate attached to the circuit board and to a socket for the integrated circuit package.

10. The connector of claim 1, wherein the connector housing comprises side walls on each of two sides of the connector housing connectors, wherein the spring members comprise coil springs extending through the side walls on the two sides.

11. The connector of claim 10, further comprising a vertical groove in each side wall to serve as a mechanical mating feature to align with a corresponding feature on a socket.

12. The connector of claim 11, wherein the mechanical mating feature aligns the connector with the socket and substantially eliminates horizontal movement of the connector.

13. A computing device comprising:
    a motherboard;
    a memory attached to the motherboard;
    a socket attached to the motherboard;
    a packaged processor attached to the socket; and
    a connector attached to the socket, the connector including a connector housing, the connector housing having a bottom surface, and a plurality of resilient connectors opposite the bottom surface to electrically connect to a corresponding plurality of pads of an integrated circuit package, a cable connector to electrically connect the resilient connectors to a cable, a base plate having a bottom surface to press against the motherboard, and a top surface opposite the bottom surface, and plurality of spring members coupled between the base plate and the connector bottom surface to press the base plate bottom surface against the motherboard and to press the connector housing connectors against the package.

14. The computing device of claim 13, wherein the spring members comprise coil springs mounted at each of four corners of the top surface of the base plate and contacting the bottom surface of the connector housing.

15. The computing device of claim 13, wherein the spring members comprise leaf springs formed in the base plate and extending from the base plate to the bottom surface of the connector housing.

16. The computing device of claim 13, wherein the connector housing comprises side walls on each of two sides of the connector housing connectors, wherein the spring members comprise coil springs extending through the side walls on the two sides.

17. The computing device of claim 13, wherein the connector is fastened to the circuit board using screws.

18. A method comprising:
attaching a socket to a circuit board, the socket configured to hold an integrated circuit die package;
attaching a connector to the socket, the connector having a housing, the connector housing having a bottom surface, and a plurality of resilient connectors opposite the bottom surface to electrically connect to a corresponding plurality of pads of an integrated circuit package, the connector having a cable connector to electrically connect the resilient connectors to a cable, the connector having a base plate having a bottom surface to press against the circuit board, and a top surface opposite the bottom surface, and the connector having a plurality of spring members coupled between the base plate and the connector bottom surface to press the base plate bottom surface against the circuit board and to press the connector housing connectors against the package; and
placing an integrated circuit die package in the socket, so that a first contact area of the package connects to the socket and a second contact area of the package connects to the connector.

19. The method of claim 18, wherein placing comprises pressing the spring members against the circuit board so that the base plate bottom surface presses against the circuit board to ensure a connection between the second contact area and the connector.

20. The method of claim 18, wherein attaching the connector comprises sliding a vertical groove on each of two side walls of the connector housing across a mating finger on the socket to align the groove with a corresponding finger and substantially eliminate horizontal movement of the connector.

* * * * *